United States Patent
Wang et al.

(10) Patent No.: US 10,944,418 B2
(45) Date of Patent: Mar. 9, 2021

(54) ANALOG-TO-DIGITAL CONVERTER CAPABLE OF GENERATE DIGITAL OUTPUT SIGNAL HAVING DIFFERENT BITS

(71) Applicant: MEDIATEK INC., Hsin-Chu (TW)

(72) Inventors: Ting-Yang Wang, Hsinchu (TW); Hung-Yi Hsieh, Hsinchu (TW); Tzu-An Wei, Hsinchu (TW); Tien-Yu Lo, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/188,217

(22) Filed: Nov. 12, 2018

(65) Prior Publication Data

US 2019/0238151 A1 Aug. 1, 2019

Related U.S. Application Data

(60) Provisional application No. 62/622,221, filed on Jan. 26, 2018.

(51) Int. Cl.
  *H03M 3/00* (2006.01)
  *H03M 1/00* (2006.01)
  *H03M 1/38* (2006.01)

(52) U.S. Cl.
  CPC ............ *H03M 3/32* (2013.01); *H03M 1/007* (2013.01); *H03M 3/426* (2013.01); *H03M 3/436* (2013.01);
  (Continued)

(58) Field of Classification Search
  CPC .... H03M 1/468; H03M 3/464; H03M 1/0695; H03M 3/424; H03M 1/66; H03M 1/365;
  (Continued)

(56) References Cited

U.S. PATENT DOCUMENTS 5,369,403 A 11/1994 Temes et al.
6,362,762 B1 3/2002 Jensen et al.
(Continued)

FOREIGN PATENT DOCUMENTS

| TW | 201706776 A | 2/2017 |
| TW | 201725867 A | 7/2017 |
| TW | 201731222 A | 9/2017 |

OTHER PUBLICATIONS

Marcus Yip et al., A Resolution-Reconfigurable 5-to-10-Bit 0.4-to-1 V Power Scalable SAR ADC for Sensor Applications, IEEE Journal of Solid-State Circuits, vol. 48, No. 6, Jun. 2013, pp. 1453-1464, IEEE, XP011510724.

(Continued)

*Primary Examiner* — Linh V Nguyen
(74) *Attorney, Agent, or Firm* — Wolf, Greenfield & Sacks, P.C.

(57) ABSTRACT

The present invention provides an ADC for receiving at least an input signal to generate a digital output signal, wherein the ADC includes an input terminal and a plurality of output terminals, the input terminal is arranged to receive the input signal, and each of the output terminals is configured to output one bit of the digital output signal. The ADC is controlled to operate in a normal mode or a low power mode, and when the ADC operates in the normal mode, all of the output terminals are enabled to output the bits to form the digital output signal; and when the ADC operates in the low power mode, only a portion of the output terminals are enabled to output the bits to form the digital output signal.

7 Claims, 9 Drawing Sheets

(52) U.S. Cl.
CPC .............. *H03M 3/464* (2013.01); *H03M 1/38* (2013.01); *H03M 3/30* (2013.01)

(58) Field of Classification Search
CPC ............ H03M 3/37; H03M 1/12; H03M 1/46; H03M 1/00; H03M 3/30
USPC ........................................ 341/143, 155, 172
See application file for complete search history.

(56) References Cited

U.S. PATENT DOCUMENTS

| | | | | |
|---|---|---|---|---|
| 6,642,873 | B1* | 11/2003 | Kuang | H03M 3/424 341/143 |
| 6,674,381 | B1* | 1/2004 | Gomez | H03M 3/328 341/143 |
| 6,894,632 | B1 | 5/2005 | Robinson | |
| 6,980,144 | B1 | 12/2005 | Maloberti et al. | |
| 7,423,567 | B2 | 9/2008 | Melanson | |
| 7,498,962 | B2 | 3/2009 | Alfano | |
| 7,778,827 | B2 | 8/2010 | Jelinek et al. | |
| 2005/0251387 | A1 | 11/2005 | Jelinek et al. | |
| 2009/0212983 | A1* | 8/2009 | Fukuzawa | H03M 1/1019 341/142 |
| 2009/0303093 | A1* | 12/2009 | Gribok | H03M 1/002 341/141 |
| 2011/0018752 | A1* | 1/2011 | Takayama | H03M 1/002 341/143 |
| 2011/0148683 | A1* | 6/2011 | Bremner | H03M 1/002 341/158 |
| 2012/0112943 | A1* | 5/2012 | Lin | H03M 3/412 341/143 |
| 2015/0002323 | A1* | 1/2015 | Arai | H03M 1/46 341/120 |
| 2017/0019124 | A1* | 1/2017 | Breems | H03M 3/50 |
| 2017/0288693 | A1* | 10/2017 | Kumar | H03M 3/468 |
| 2018/0219559 | A1* | 8/2018 | Lee | H03M 3/434 |

OTHER PUBLICATIONS

Sreehari Veeramachanen et al., Design of a Low Power, Variable-Resolution Flash ADC, 2009 22nd International Conference on VLSI Design, 2009 IEEE, pp. 117-122, XP031406905, 2009.

* cited by examiner

ANALOG-TO-DIGITAL CONVERTER CAPABLE OF GENERATE DIGITAL OUTPUT SIGNAL HAVING DIFFERENT BITS

CROSS REFERENCE TO RELATED APPLICATIONS

This application claims the priority of U.S. Provisional Application No. 62/622,221, filed on Jan. 26, 2018, which is included herein by reference in its entirety.

BACKGROUND

Many electronic devices, such as cellular phones, have an analog-to-digital converter (ADC) supporting a normal mode and a low power mode. In the multi-mode ADC applications, the conventional ADC is controlled to lower an order of a loop filter or lower a clock frequency of the ADC to achieve the low power application. However, the method of lowering the order of the loop filter needs to re-synthesize the coefficients to fit the desired noise transfer function, and the method of lowering the clock frequency needs large area for loop filter capacitors, or a mixed system is required to take care of the two clock frequencies. Therefore, the conventional control method of the ADC is not straightforward, time consuming and complicated.

SUMMARY

It is therefore an objective of the present invention to provide an ADC, which can operate in the low power mode by simply reducing quantizer/ADC bits, to solve the above-mentioned problems.

According to one embodiment of the present invention, an ADC is provided for receiving at least an input signal to generate a digital output signal, wherein the ADC includes an input terminal and a plurality of output terminals, the input terminal is arranged to receive the input signal, and each of the output terminals is configured to output one bit of the digital output signal. The ADC is controlled to operate in a normal mode or a low power mode, and when the ADC operates in the normal mode, all of the output terminals are enabled to output the bits to form the digital output signal; and when the ADC operates in the low power mode, only a portion of the output terminals are enabled to output the bits to form the digital output signal.

According to another embodiment of the present invention, a control method of an ADC comprises the steps of: when the ADC operates in a normal mode, controlling the ADC to receiving at least an input signal to generate a digital output signal having N bits; and when the ADC operates in a low power mode, controlling the ADC to receiving the input signal to generate the digital output signal having M bits, wherein M is less than N.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
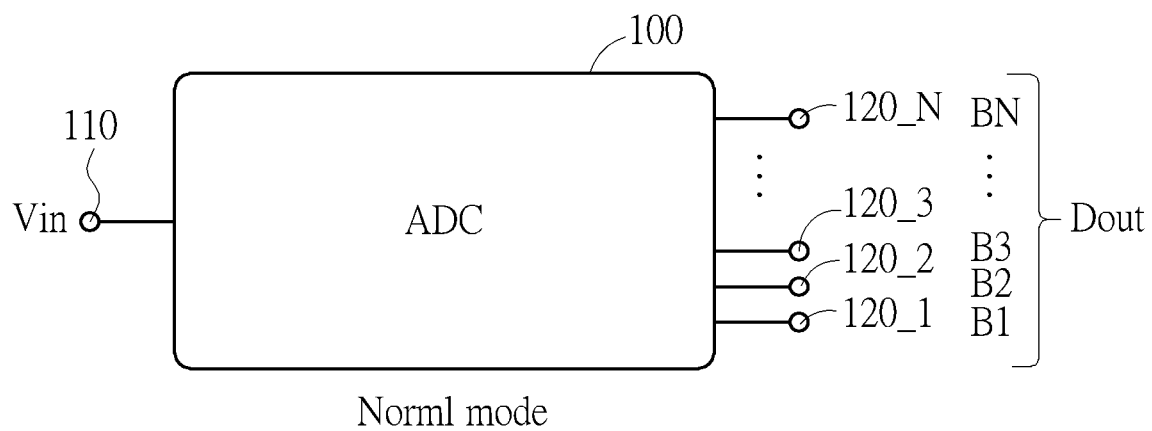
FIG. 1 is a diagram illustrating an ADC operating in the normal mode and the low power mode according to a first embodiment of the present invention.
Figure 1:
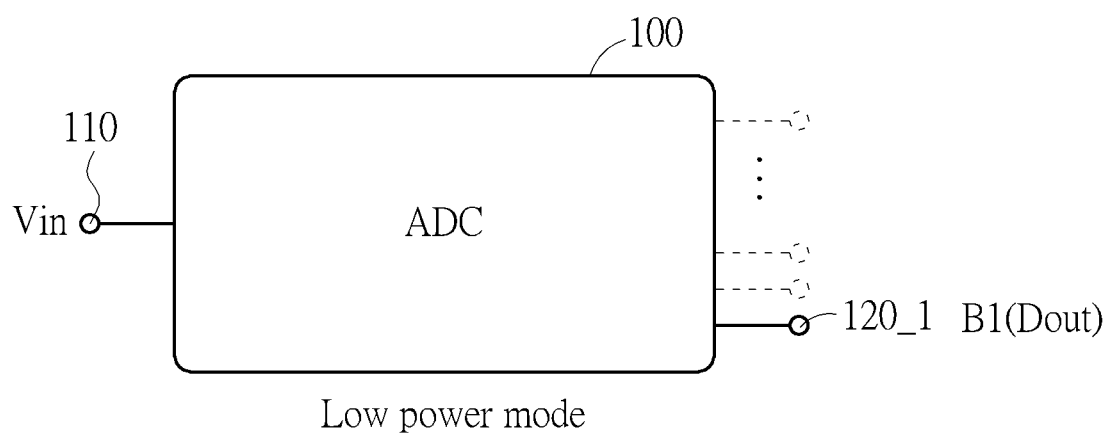

FIG. 1 is a diagram illustrating an ADC 100 operating in the normal mode and the low power mode according to a first embodiment of the present invention. As shown in FIG. 1, the ADC 100 comprises an input terminal 110 and a plurality of output terminals 120_1-120_N, where the input terminal 110 is arranged to receive an input signal (analog signal) Vin, and the output terminals 120_1-120_N are arranged to generate bits B1-BN, respectively.

When the ADC 100 operates in the normal mode, all of the output terminals 120_1-120_N are enabled to generate the bits B1-BN, respectively, that is the ADC 110 generates a digital output signal Dout having N bits (i.e. B1-BN). In addition, when the ADC 100 operates in the low power mode, because an amplitude of the input signal Vin becomes smaller, only a portion of the bits are utilized to represent the input signal Vin, so a portion of elements within the ADC 100 can be disabled to not generate the corresponding bits. In the embodiment shown in FIG. 1, the ADC 100 generates the digital output signal Dout having only one bit B1, and the other output terminals 120_2-120_N are disabled.

It is noted that a bit number of the digital output signal Dout in the low power mode is for illustratively only. As long as the bit number of the digital output signal Dout in the low power mode is less than the bit number (i.e. N) of the digital output signal Dout in the normal mode, the digital output signal Dout may have one bit, two bits or three bits in the low power mode.

Figure 2:
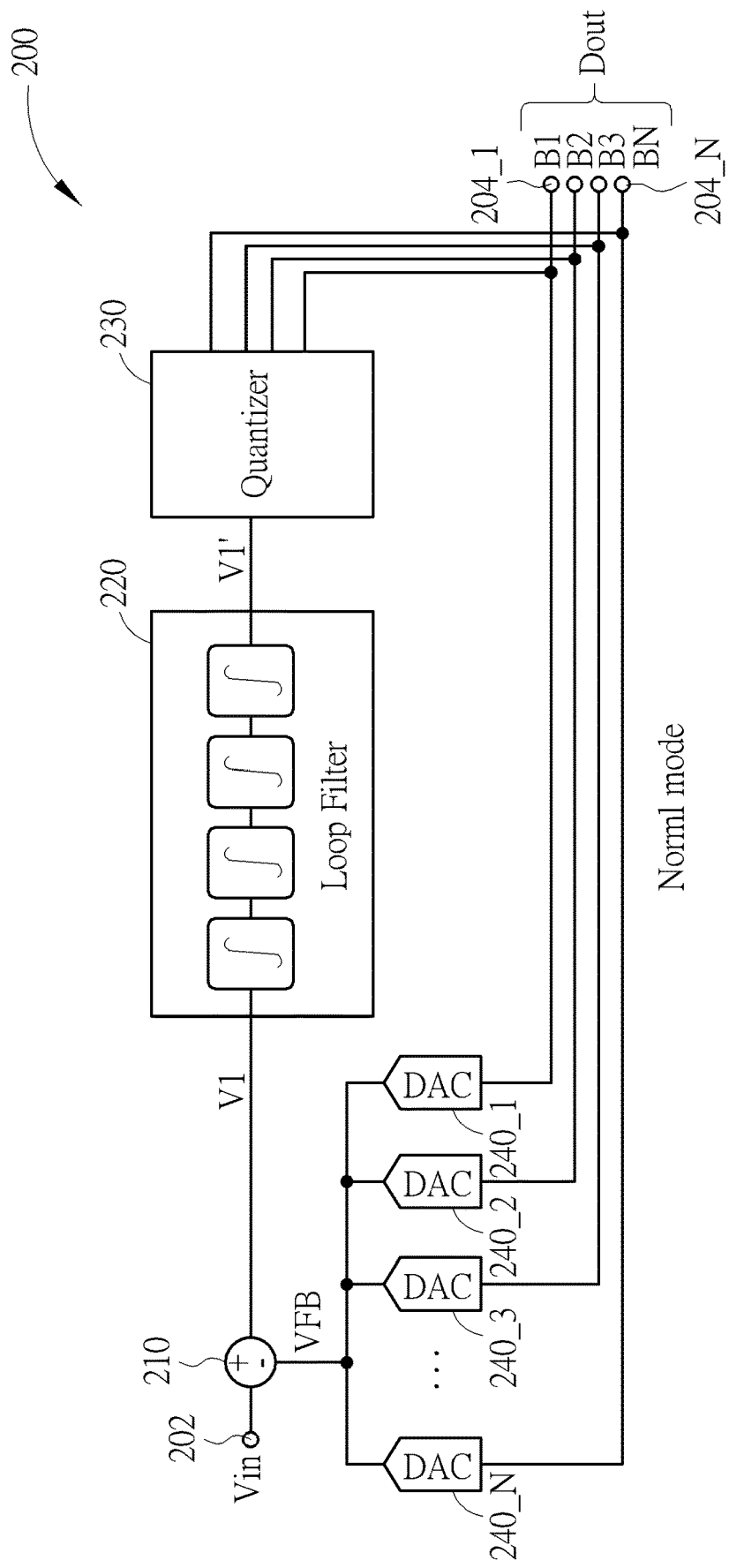
FIG. 2 is a diagram illustrating an ADC operating in the normal mode according to a second embodiment of the present invention.
Figure 3:
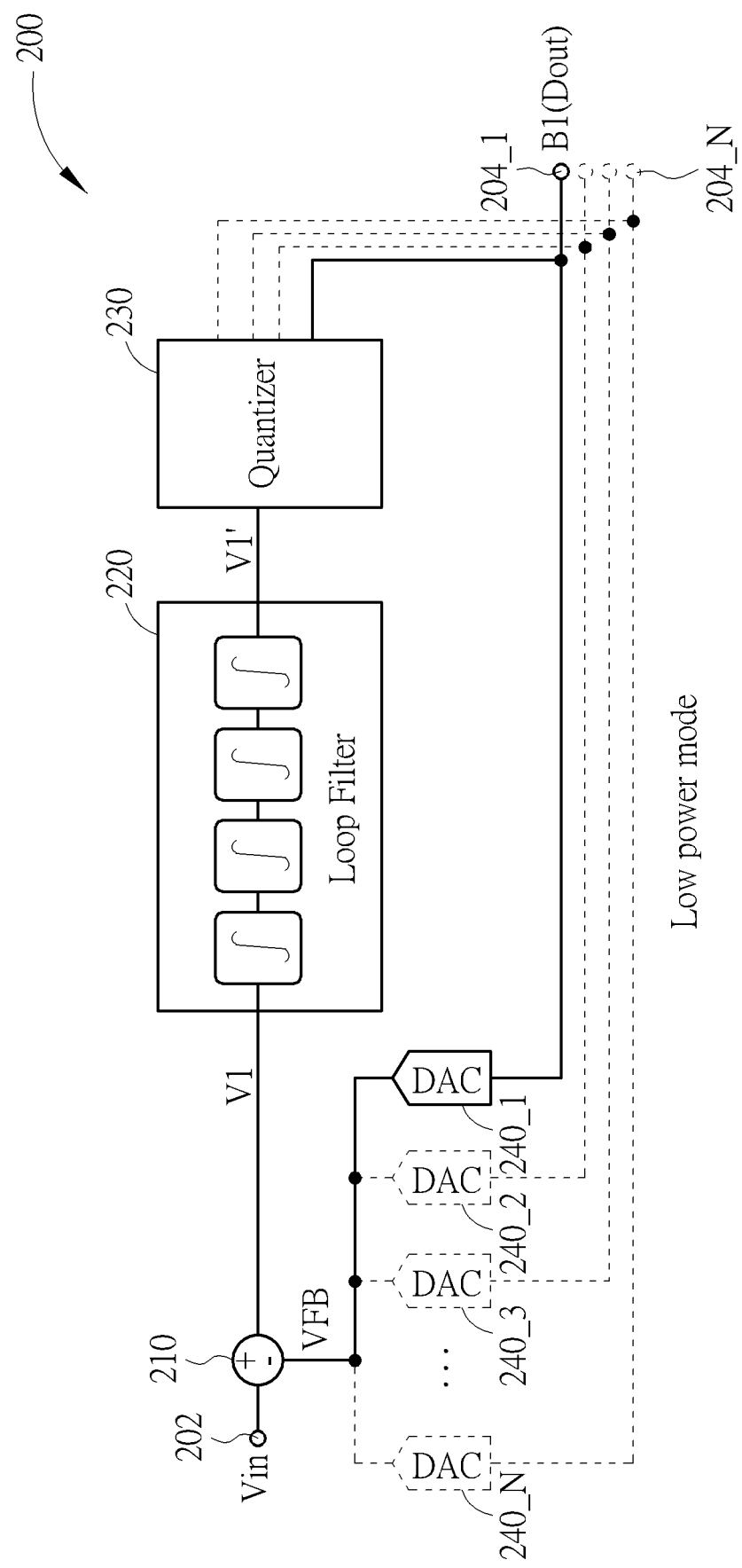
FIG. 3 is a diagram illustrating the ADC operating in the low power mode according to the second embodiment of the present invention.

FIG. 2 is a diagram illustrating an ADC 200 operating in the normal mode according to a second embodiment of the present invention, and FIG. 3 is a diagram illustrating the ADC 200 operating in the low power mode according to the second embodiment of the present invention. As shown in FIG. 2, the ADC 200 is a sigma-delta modulator ADC, and the ADC 200 comprises an input terminal 202, a receiving circuit 210, a loop filter 220, a quantizer 230, a plurality of output terminals 204_1-204_N, and a plurality of digital-to-analog converters (DACs) 240_1-240_N.

In the operations of the ADC 200, the input terminal 202 is arranged to receive an input signal Vin. The receiving circuit 210 is arranged to subtract a feedback signal VFB from the input signal Vin to generate a first signal V1. The loop filter 220 comprises a plurality of integrators connected in series, and the loop filter 220 is configured to filter the first signal V1 to generate a filtered signal V1'. The quantizer 230 is configured to generate the digital output signal Dout according to the filtered signal V1'. The DACs 240_1-240_N are coupled to the output terminals 204_1-204_N, respectively, and each of the DACs 240_1-240_N receives one bit of the corresponding output terminal, if any, to generate an analog signal, and a summation of the analog signals of the DACs 240_1-240_N serves as the feedback signal VFB.

In the embodiment shown in FIG. 2, when the ADC 200 operates in the normal mode, the quantizer 230 generates the digital output signal Dout having N bits (i.e. the digital output signal Dout comprises the bits B1-BN), and all of the DACs 240_1-240_N are enabled to receive the bits B1-BN to generate the analog signals, respectively. In the embodiment shown in FIG. 3, when the ADC 200 operates in the low power mode, the quantizer 230 generates the digital output signal Dout having only one bit B1, and only the DAC 240_1 is enabled to receive the bit B1 to generate the corresponding analog signal serving as the feedback signal VFB.

In the embodiment shown in FIG. 3, because the low power mode can be simply achieved by disabling a portions of elements within the quantizer 230 and disabling a portion of the DACs 240_1-240_N, and the bit B1 is utilized to represent the input signal Vin because the amplitude of the input signal Vin becomes smaller in the low power mode, the embodiment can lower the design efforts of the multi-mode applications of the ADC.

In one embodiment, the order of the loop filter 220 (i.e. the number of the enabled integrators within the loop filter 220) and a clock frequency used by the quantizer 230 are not changed in the normal mode and the low power mode. That is the ADC 200 uses the same order of the loop filter 220 and the clock frequency of the quantizer 230 in the normal mode and low power mode. Therefore, the ADC 200 does not need to re-synthesize the coefficients to fit the desired noise transfer function, and the design efforts and manufacturing cost can be lowered.

It is noted that a bit number of the digital output signal Dout in the low power mode is for illustratively only. As long as the bit number of the digital output signal Dout in the low power mode is less than the bit number (i.e. N) of the digital output signal Dout in the normal mode, the digital output signal Dout may have one bit, two bits or three bits in the low power mode.

Figure 4:
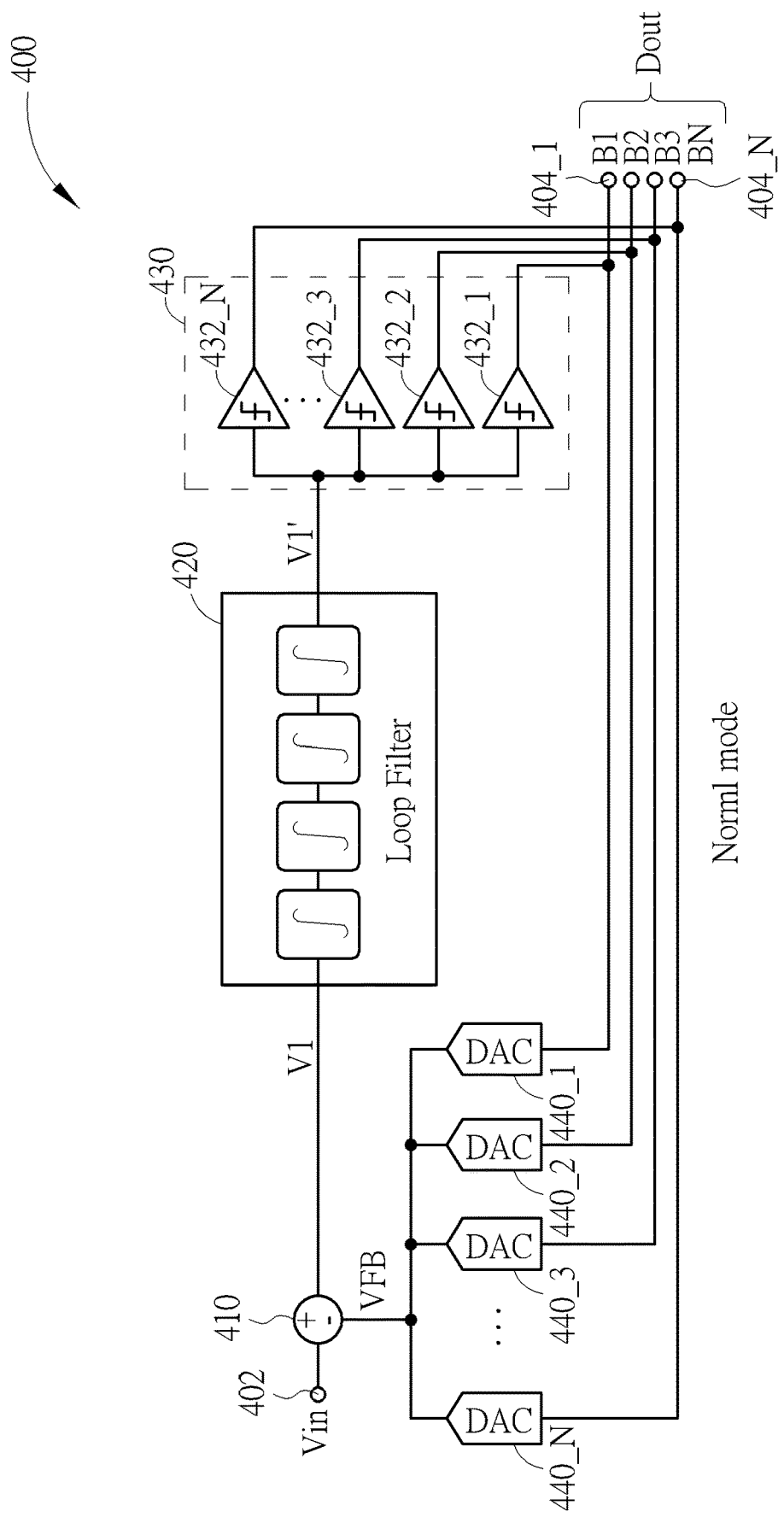
FIG. 4 is a diagram illustrating an ADC operating in the normal mode according to a third embodiment of the present invention.
Figure 5:
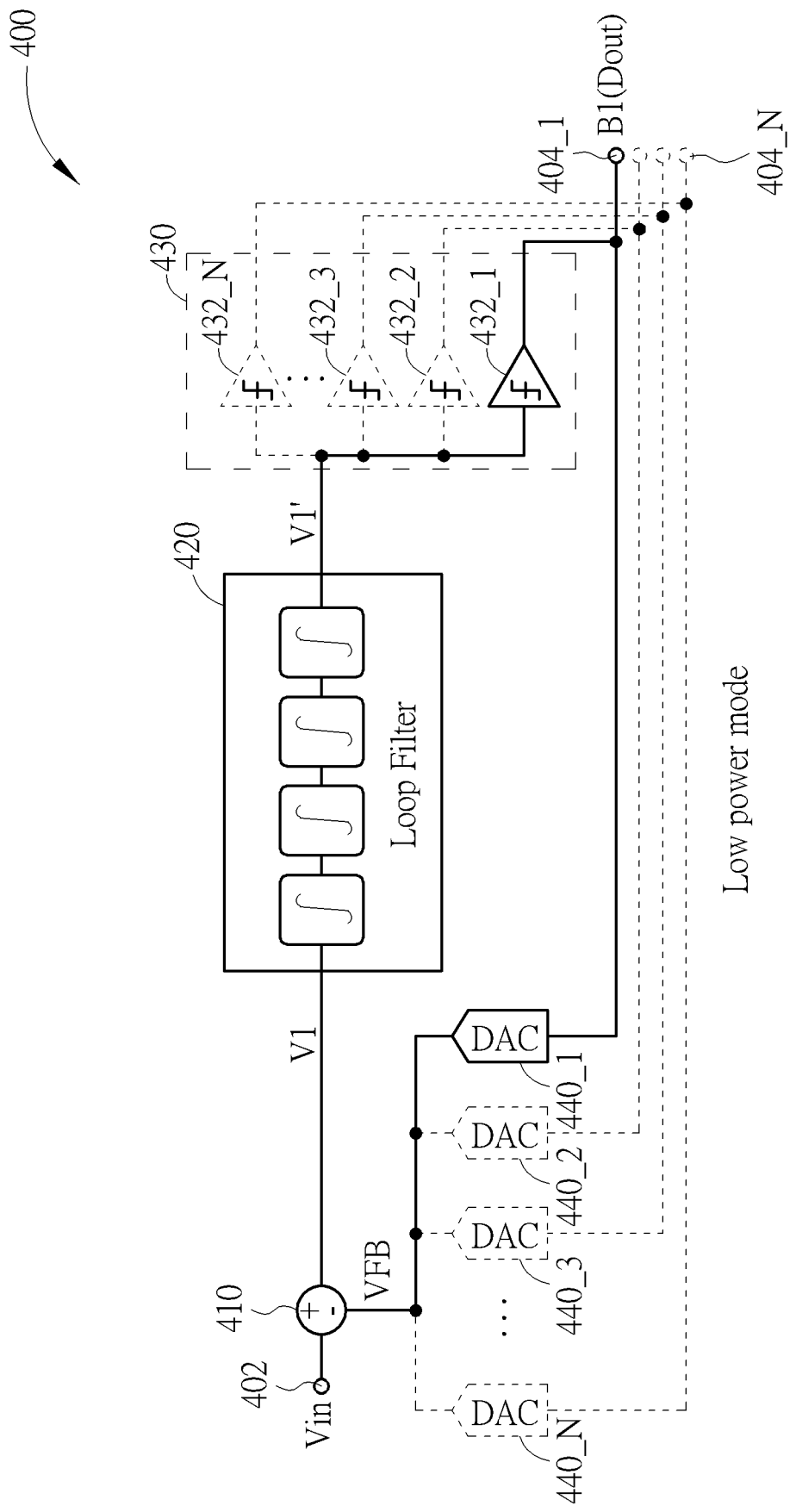
FIG. 5 is a diagram illustrating the ADC operating in the low power mode according to the third embodiment of the present invention.

FIG. 4 is a diagram illustrating an ADC 400 operating in the normal mode according to a third embodiment of the present invention, and FIG. 5 is a diagram illustrating the ADC 400 operating in the low power mode according to the third embodiment of the present invention. As shown in FIG. 4, the ADC 400 is a sigma-delta modulator ADC, and the ADC 400 comprises an input terminal 402, a receiving circuit 410, a loop filter 420, a quantizer 430, a plurality of output terminals 404_1-404_N, and a plurality of DACs 440_1-40_N, wherein the quantizer 430 is a flash quantizer comprising a plurality of comparators 432_1-432_N.

In the operations of the ADC 400, the input terminal 402 is arranged to receive an input signal Vin. The receiving circuit 410 is arranged to subtract a feedback signal VFB from the input signal Vin to generate a first signal V1. The loop filter 420 comprises a plurality of integrators connected in series, and the loop filter 420 is configured to filter the first signal V1 to generate a filtered signal V1'. The quantizer 430 is configured to generate the digital output signal Dout according to the filtered signal V1', wherein the comparators 432_1-432_N is configured to compare the filtered signal V1' with a corresponding reference signal to generate the bits B1-BN of the digital output signal Dout, respectively. The DACs 440_1-440_N are coupled to the output terminals 404_1-404_N, respectively, and each of the DACs 440_1-440_N receives one bit of the corresponding output terminal, if any, to generate an analog signal, and a summation of the analog signals of the DACs 440_1-440_N serves as the feedback signal VFB.

In the embodiment shown in FIG. 4, when the ADC 400 operates in the normal mode, all of the comparators 432_1-432_N within the quantizer 430 are enabled to generate the digital output signal Dout having N bits (i.e. the bits B1-BN), and all of the DACs 440_1-440_N are enabled to receive the bits B1-BN to generate the analog signals, respectively. In the embodiment shown in FIG. 5, when the ADC 400 operates in the low power mode, only the comparator 432_1 is enabled to generate the bit B1, that is the quantizer 430 generates the digital output signal Dout having only one bit B1, and only the DAC 440_1 is enabled to receive the bit B1 to generate the corresponding analog signal serving as the feedback signal VFB.

In one embodiment, the order of the loop filter 420 (i.e. the number of the enabled integrators within the loop filter 420) and a clock frequency used by the quantizer 430 are not changed in the normal mode and the low power mode. That is the ADC 400 uses the same order of the loop filter 420 and the clock frequency of the quantizer 430 in the normal mode and low power mode. Therefore, the ADC 400 does not need to re-synthesize the coefficients to fit the desired noise transfer function, and the design efforts and manufacturing cost can be lowered.

It is noted that a bit number of the digital output signal Dout in the low power mode is for illustratively only. As long as the bit number of the digital output signal Dout in the low power mode is less than the bit number (i.e. N) of the digital output signal Dout in the normal mode, the digital output signal Dout may have one bit, two bits or three bits in the low power mode.

Figure 6:
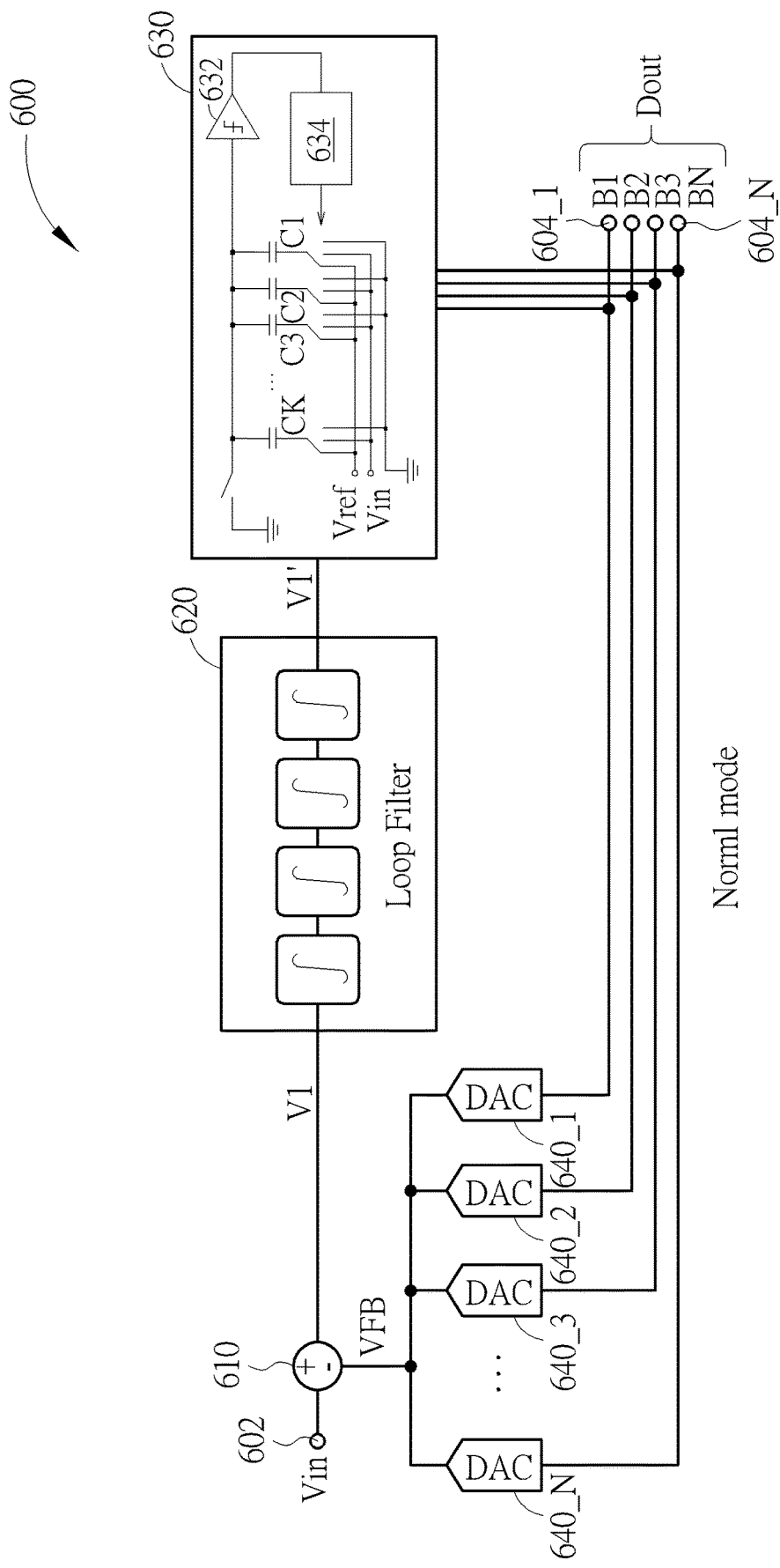
FIG. 6 is a diagram illustrating an ADC operating in the normal mode according to a fourth embodiment of the present invention.
Figure 7:
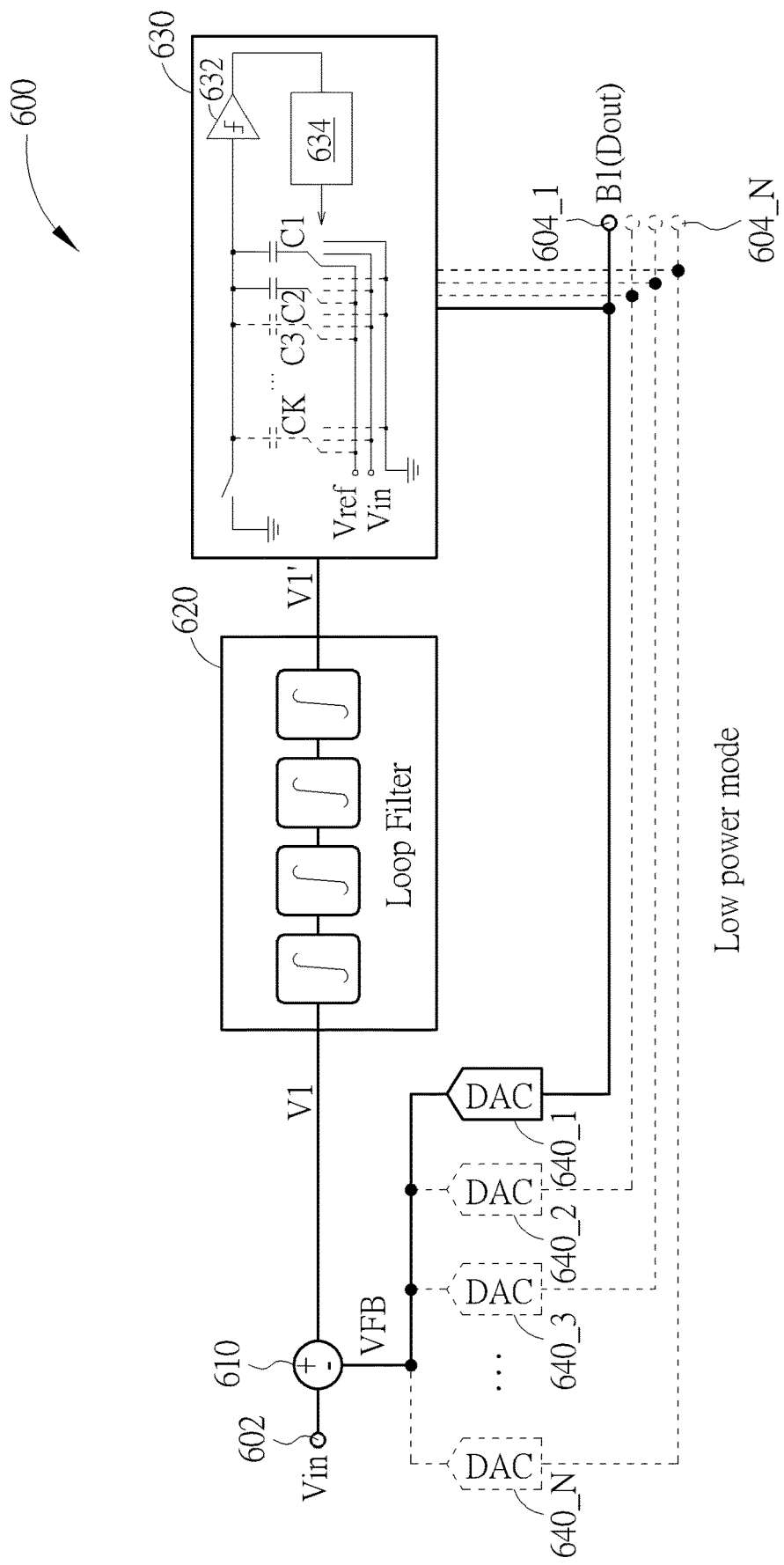
FIG. 7 is a diagram illustrating the ADC operating in the low power mode according to the fourth embodiment of the present invention.

FIG. 6 is a diagram illustrating an ADC 600 operating in the normal mode according to a fourth embodiment of the present invention, and FIG. 7 is a diagram illustrating the ADC 600 operating in the low power mode according to the fourth embodiment of the present invention. As shown in FIG. 6, the ADC 600 comprises an input terminal 602, a receiving circuit 610, a loop filter 620, a quantizer 630, a plurality of output terminals 604_1-604_N, and a plurality of DACs 640_1-640_N. In this embodiment, the ADC 600 is a sigma-delta modulator ADC, and the quantizer 630 is a successive approximation register (SAR) quantizer. The quantizer 630 comprises a plurality of capacitors C1-CK, a comparator 632 and a control logic 634.

In the operations of the ADC 600, the input terminal 602 is arranged to receive an input signal Vin. The receiving circuit 610 is arranged to subtract a feedback signal VFB from the input signal Vin to generate a first signal V1. The loop filter 620 comprises a plurality of integrators connected in series, and the loop filter 620 is configured to filter the first signal V1 to generate a filtered signal V1'. The quantizer 630 is configured to generate the digital output signal Dout according to the filtered signal V1'. In detail, in the operations of the quantizer 630, a first node of each of the capacitors is controlled to connect to the filtered signal V1', a reference signal Vref or a ground voltage according to a control signal to sample the filtered signal V1' to generate a sampled signal; the comparator 632 compares the sampled signal with another reference signal to generate a comparison result, and the control logic 634 generates the digital output signal Dout, and further generates the control signals to control the capacitors C1-CK according to the comparison result. The DACs 640_1-640_N are coupled to the output terminals 604_1-604_N, respectively, and each of the DACs 640_1-640_N receives one bit of the corresponding output terminal, if any, to generate an analog signal, and a summation of the analog signals of the DACs 640_1-640_N serves as the feedback signal VFB.

In the embodiment shown in FIG. 6, when the ADC 600 operates in the normal mode, all of the capacitors C1-CK within the quantizer 630 are used to generate the sampled signal for the comparator 632 and the control logic 634 to generate the digital output signal Dout having N bits (i.e. the bits B1-BN), and all of the DACs 640_1-640_N are enabled to receive the bits B1-BN to generate the analog signals, respectively. In the embodiment shown in FIG. 7, when the ADC 600 operates in the low power mode, only the capacitors C1 and C2 are used to generate the sampled signal, and the control logic 634 generates the digital output signal Dout having only one bit B1, and only the DAC 640_1 is enabled to receive the bit B1 to generate the corresponding analog signal serving as the feedback signal VFB.

In one embodiment, the order of the loop filter 620 (i.e. the number of the enabled integrators within the loop filter 620) and a clock frequency used by the quantizer 630 are not changed in the normal mode and the low power mode. That is the ADC 600 uses the same the order of the loop filter 620 and the clock frequency of the quantizer 630 in the normal mode and low power mode. Therefore, the ADC 600 does not need to re-synthesize the coefficients to fit the desired noise transfer function, and the design efforts and manufacturing cost can be lowered.

It is noted that a bit number of the digital output signal Dout in the low power mode is for illustratively only. As long as the bit number of the digital output signal Dout in the low power mode is less than the bit number (i.e. N) of the digital output signal Dout in the normal mode, the digital output signal Dout may have one bit, two bits or three bits in the low power mode.

Figure 8:
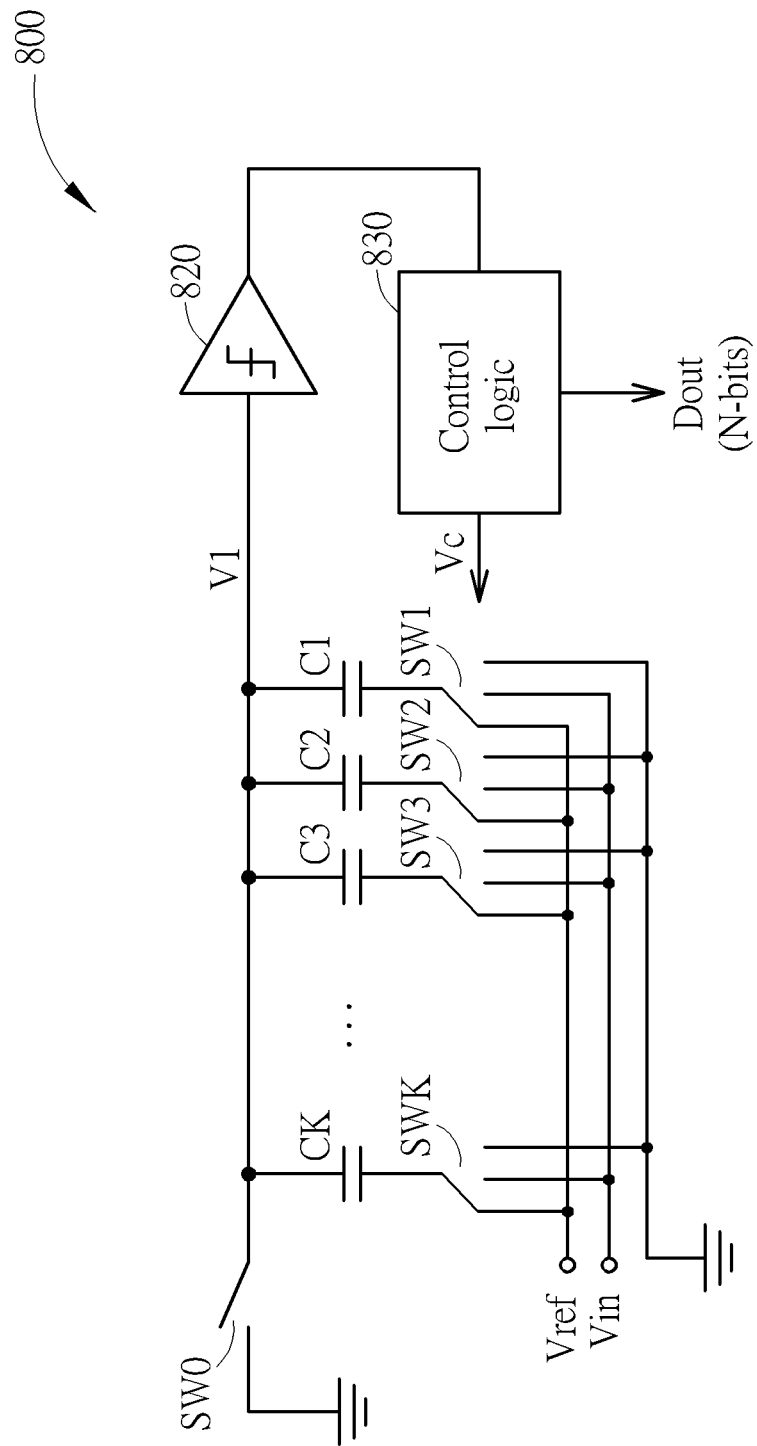
FIG. 8 is a diagram illustrating an ADC operating in the normal mode according to a fifth embodiment of the present invention.
Figure 9:
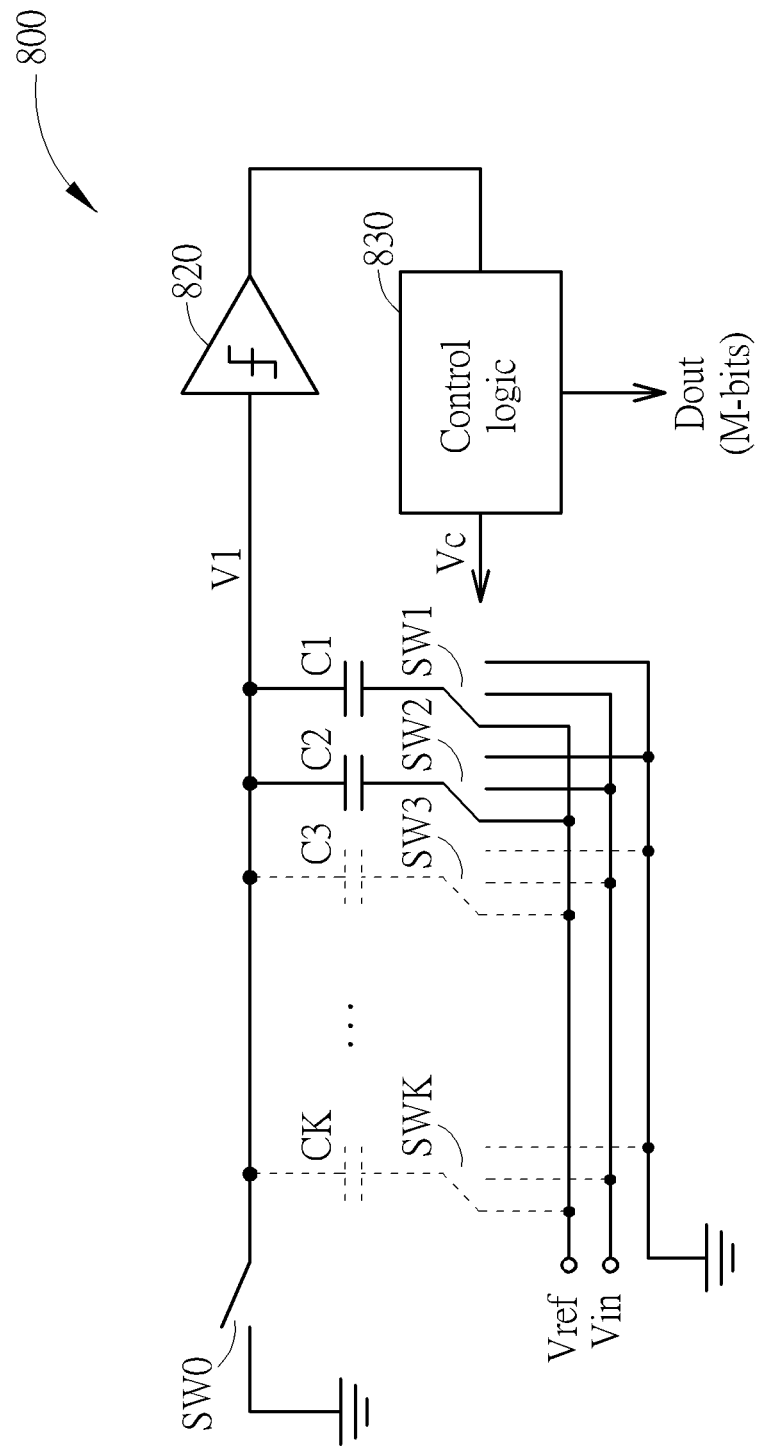
FIG. 9 is a diagram illustrating the ADC operating in the low power mode according to the fifth embodiment of the present invention.

FIG. 8 is a diagram illustrating an ADC 800 operating in the normal mode according to a fifth embodiment of the present invention, and FIG. 9 is a diagram illustrating the ADC 800 operating in the low power mode according to the fifth embodiment of the present invention. As shown in FIG. 8, the ADC 800 is a SAR ADC, and the ADC 800 comprises a plurality of capacitors C1-CK, a plurality of switches SW1-SWK, a comparator 820 and a control logic 830, where a first node of each of the capacitors C1-CK is controlled to connect to the input signal Vin, a reference signal Vref or a ground voltage via the corresponding switch SW1-SWK, second nodes of the capacitors C1-CK are connected together, and the second nodes of the capacitors C1-CK are selectively connected to the ground voltage via a switch SW0.

In the operations of the ADC 800, the capacitors C1-CK are controlled connect to the input signal Vin, the reference signal Vref or the ground voltage, to sample the input signal Vin to generate the sampled signal V1. The comparator 820 compares the sampled signal V1 with another reference voltage to generate the comparison result. The control logic 830 generates the digital output signal Dout having N bits, and further generates the control signals Vc to control the switches SW1-SWK for sampling the input signal Vin in a next cycle according to the comparison result.

In the embodiment shown in FIG. 8, when the ADC 800 operates in the normal mode, all of the capacitors C1-CK are used to generate the sampled signal for the comparator 820 and the control logic 830 to generate the digital output signal Dout having N bits. In the embodiment shown in FIG. 9, when the ADC 800 operates in the low power mode, only the capacitors C1 and C2 are used to generate the sampled signal, and the control logic 830 generates the digital output signal Dout having M bit(s), where M is less than N.

It is noted that the ADCs 100, 200, 400, 600 and 800 are not limited to receive only one input signal Vin shown in FIGS. 1-9. In other embodiments, the ADC 100, 200, 400, 600 or 800 may receive one or more input signals to generate the digital output signal.

Briefly summarized, in the ADC of the present invention, the ADC can simply reduce the bit number of the digital output signal to achieve the low power application. In addition, because the digital output signal having less bits is sufficient to represent the input signal because the amplitude of the input signal Vin becomes smaller in the low power mode, the embodiments of the present invention indeed lower the design efforts of the multi-mode applications of the ADC without losing performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converter (ADC) for receiving at least an input signal to generate a digital output signal, comprising:
   an input terminal, for receiving the input signal; and
   a plurality of output terminals, wherein each of the output terminals is configured to output one bit of the digital output signal;
   wherein the ADC is controlled to operate in a normal mode, and when the ADC operates in the normal mode, all of the output terminals are enabled to output the bits to form the digital output signal; and
   wherein the ADC is controlled to operate in a low power mode, and when the ADC operates in the low power mode, only a subset of the output terminals are enabled to output the bits to form the digital output signal;
   wherein the ADC further comprises;
   a receiving circuit for receiving the input signal and a feedback signal to generate a first signal;
   a loop filter, coupled to the receiving circuit, for filtering the first signal to generate a filtered signal;

a quantizer, coupled to the loop filter and the plurality of output terminals, for generating the digital output signal according to the filtered signal; and a plurality of digital-to-analog converters (DACs), coupled to the plurality of output terminals, respectively, wherein each of the DACs receives one bit of the corresponding output terminal to generate an analog signal, and a summation of the analog signals of the DACs serves as the feedback signal;

wherein the quantizer is configured to generate the digital output signal; and wherein the DACs are controlled to be enabled when the ADC operates in the normal mode, and wherein a subset of the DACs is controlled to be disabled when the ADC operates in the low power mode.

2. The ADC of claim 1, wherein a bit number of the digital output signal in the normal mode is greater than a bit number of the digital output signal in the low power mode.

3. The ADC of claim 1, wherein when the ADC operates in the low power mode, the ADC generates the digital output signal having only one bit or only two bits.

4. The ADC of claim 1, wherein when the ADC operates in the normal mode, the quantizer is configured to generate the digital output signal having N bits, and all of the DACs are enabled to generate the analog signals, respectively; and when the ADC operates in the low power mode, the quantizer is configured to generate the digital output signal having M bits, and only the subset of the DACs are enabled to generate the analog signals, wherein M is less than N.

5. The ADC of claim 1, wherein the quantizer comprises a plurality of comparators, each comparator is configured to generate one bit of the digital output signal, and a subset of the comparators is controlled to be enabled or disabled based on whether the ADC is in the normal mode or the low power mode.

6. The ADC of claim 1, wherein the quantizer is a successive approximation register (SAR) quantizer, and the quantizer comprises:

a plurality of capacitors, wherein a first node of each of the capacitors is controlled to connect to the filtered signal or a reference signal according to a control signal, to sample the filtered signal to generate a sampled signal;

a comparator, for comparing the sampled signal with another reference signal to generate a comparison result; and a control logic, for generating the digital output signal, and further generating the control signals to control the plurality of capacitors according to the comparison result;

wherein a subset of the capacitors is controlled to be enabled or disabled based on whether the ADC is in the normal mode or the low power mode.

7. The ADC of claim 1, wherein an order of the loop filter or a frequency of a clock signal used by the quantizer is not changed according to the normal mode or the low power mode of the ADC.

* * * * *